(12) United States Patent
Loubet et al.

(10) Patent No.: US 9,000,491 B2
(45) Date of Patent: Apr. 7, 2015

(54) LAYER FORMATION WITH REDUCED CHANNEL LOSS

(71) Applicant: STMicroelectronics, Inc., Coppell, TX (US)

(72) Inventors: Nicolas Loubet, Guilderland, NY (US); Qing Liu, Watervliet, NY (US); Prasanna Khare, Schenectady, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/309,409

(22) Filed: Jun. 19, 2014

(65) Prior Publication Data

US 2014/0299880 A1 Oct. 9, 2014

Related U.S. Application Data

(63) Continuation of application No. 12/971,054, filed on Dec. 17, 2010, now Pat. No. 8,796,147.

(51) Int. Cl.

| | |
|---|---|
| *H01L 29/745* | (2006.01) |
| *H01L 27/148* | (2006.01) |
| *H01L 21/311* | (2006.01) |
| *H01L 29/10* | (2006.01) |
| *H01L 29/04* | (2006.01) |
| *H01L 29/78* | (2006.01) |
| *H01L 29/66* | (2006.01) |

(52) U.S. Cl.
CPC ......... *H01L 29/1033* (2013.01); *H01L 29/6653* (2013.01); *H01L 29/66545* (2013.01); *H01L 29/66628* (2013.01); *H01L 29/66772* (2013.01); *H01L 29/04* (2013.01); *H01L 29/78* (2013.01)

(58) Field of Classification Search
CPC ...... H01L 29/1033; H01L 29/78; H01L 29/04
USPC ......... 438/149, 197, 218, 279, 526, 694, 696, 438/704, 723, 724, 743, 744; 257/213, 216, 257/229, 350, 368
See application file for complete search history.

(56) References Cited

U.S. PATENT DOCUMENTS

| | | | |
|---|---|---|---|
| 6,777,298 B2 | 8/2004 | Roy et al. | |
| 7,687,834 B2 * | 3/2010 | Kapoor | 257/256 |
| 7,759,205 B1 | 7/2010 | Maitra et al. | |
| 7,993,995 B2 * | 8/2011 | Majumdar et al. | 438/198 |
| 8,716,752 B2 | 5/2014 | Dove | |
| 2004/0129981 A1 | 7/2004 | Kim et al. | |
| 2005/0095867 A1 | 5/2005 | Shimada | |
| 2005/0156238 A1 * | 7/2005 | Wen et al. | 257/347 |
| 2007/0075385 A1 | 4/2007 | Lee et al. | |
| 2008/0237715 A1 | 10/2008 | Hisamatsu | |

(Continued)

*Primary Examiner* — Hsien Ming Lee
(74) *Attorney, Agent, or Firm* — Allen, Dyer, Doppelt, Milbrath & Gilchrist, P.A.

(57) ABSTRACT

Insulating layers can be formed over a semiconductor device region and etched in a manner that substantially reduces or prevents the amount of etching of the underlying channel region. A first insulating layer can be formed over a gate region and a semiconductor device region. A second insulating layer can be formed over the first insulating layer. A third insulating layer can be formed over the second insulating layer. A portion of the third insulating layer can be etched using a first etching process. A portion of the first and second insulating layers beneath the etched portion of the third insulating layer can be etched using at least a second etching process different from the first etching process.

26 Claims, 13 Drawing Sheets

(56) References Cited

U.S. PATENT DOCUMENTS

2009/0032874 A1 2/2009 Loubet et al.
2009/0159934 A1 6/2009 Amos et al.
2009/0179256 A1 7/2009 Lin et al.
2010/0184265 A1 7/2010 Maitra et al.

* cited by examiner

LAYER FORMATION WITH REDUCED CHANNEL LOSS

CROSS REFERENCE TO RELATED APPLICATIONS

This application claims priority to and is a continuation of U.S. patent application Ser. No. 12/971,054, filed Dec. 17, 2010, entitled LAYER FORMATION WITH REDUCED CHANNEL LOSS, which application is incorporated herein by reference in its entirety.

BACKGROUND OF THE INVENTION

1. Field of Invention

The techniques described herein relate generally to the formation and etching of regions on a semiconductor substrate. In particular, some embodiments relate to a layer deposition and etching technique capable of reducing the amount of channel loss that occurs during these processes.

2. Discussion of the Related Art

Field effect transistors can be formed in a silicon device layer having a channel region that extends laterally along the silicon device layer. It has been found that forming thinner channels can enable better control of transistor operation. One way of forming a thinner channel region is by polishing the wafer to reduce the thickness of the silicon device layer to about 6-8 nm, for example. It would be desirable to precisely control the thickness of the device layer to reduce the variation in transistor properties.

SUMMARY

Some embodiments relate to a method, comprising: forming a first insulating layer over a gate region and a semiconductor device region; forming a second insulating layer over the first insulating layer; forming a third insulating layer over the second insulating layer; etching a portion of the third insulating layer using a first etching process; and etching a portion of the first and second insulating layers beneath the etched portion of the third insulating layer using at least a second etching process different from the first etching process.

Some embodiments relate to a method, comprising: forming a first layer over a semiconductor device region, the first layer comprising a first material; forming a second layer over the first layer, the second layer comprising a second material; etching a portion of the second layer using a first etching process; and etching a portion of the first layer using a second etching process that reaches the semiconductor device region and substantially does not etch the semiconductor device region.

The foregoing is a non-limiting summary of some embodiments of the invention.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the invention.

DETAILED DESCRIPTION

Various layers can be deposited and etched to form the gate and spacer regions of a transistor over the device layer or channel layer of the transistor. In prior techniques, these etching processes can result in unintended etching of the channel region of the transistor. However, when forming transistors with channel regions that are very thin, such as on the order of 6-8 nm, unintended etching of the channel region can cause a variation in channel thickness and an undesired variation in the transistor properties such as the threshold voltage $V_{TH}$. It would be desirable to reduce unintended etching of the channel region to reduce variation in the properties of the transistors that are produced.

In some embodiments, insulating layers can be formed over the channel/device region and etched in a manner that substantially reduces or prevents the amount of etching of the underlying channel region. Exemplary techniques are described below.

Figure 1:
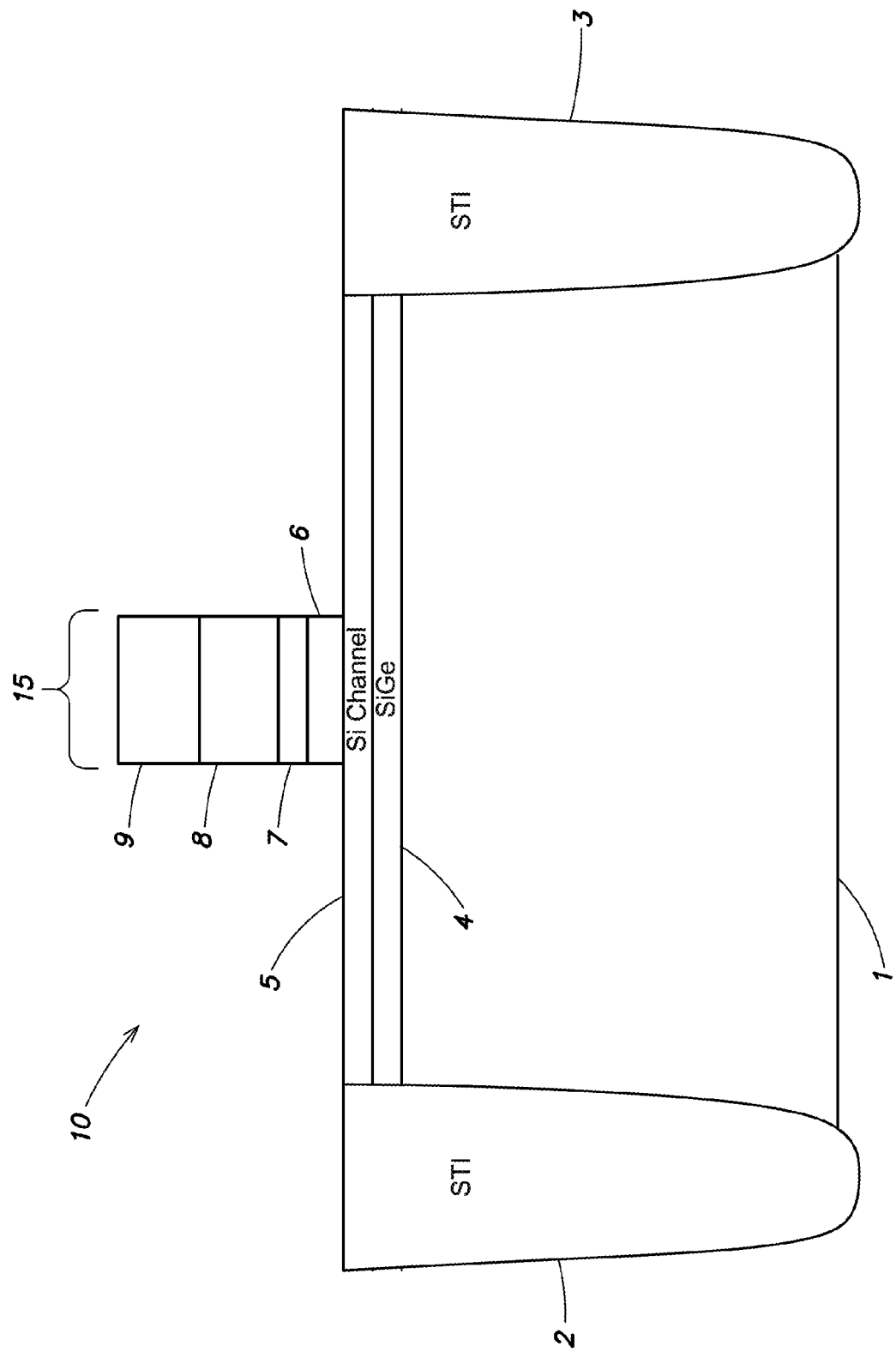
FIG. 1 shows a cross-section of a semiconductor structure.

FIG. 1 shows a cross-section of a semiconductor structure 10 that may include a semiconductor region 1, shallow trench isolation regions 2, 3, a sacrificial semiconductor region 4 above the semiconductor region 1, a semiconductor device region 5, and a gate region 15 that may include a gate dielectric layer 6, a metal layer 7, an amorphous silicon layer 8, and an insulating layer 9. However, the techniques described herein are not limited to the particular arrangement of regions and materials shown in FIG. 1.

Semiconductor region 1 may be a region of bulk semiconductor, such as single crystalline silicon or another semiconductor material. Shallow trench isolation regions 2 and 3 may be formed of silicon oxide, for example, or any other suitable insulating material.

Sacrificial semiconductor region 4 may be formed of SiGe or any other suitable material. Semiconductor device region 5 may be formed of silicon or any other suitable semiconductor material for forming the channel region of a transistor. Semiconductor device region 5 may be thin in some embodiments, such as on the order of about 6 to 8 nanometers along the vertical dimension of FIG. 1. However, semiconductor device region 5 may have any suitable thickness, as the techniques described herein are not limited in this respect. Dielectric layer 6 may be formed of a high k dielectric material, or any other suitable dielectric material. Metal layer 7 may be formed of any suitable metal gate material. Semiconductor layer 8 may be formed of amorphous silicon, or any other suitable material. Insulating layer 9 may be formed of silicon nitride, or any other suitable material. Although FIG. 1 illustrates one example of a semiconductor structure, it should be appreciated that the techniques described herein may be used with any suitable semiconductor structure having a semiconductor device layer, so that etching of the device layer can be reduced or prevented.

Figure 2:
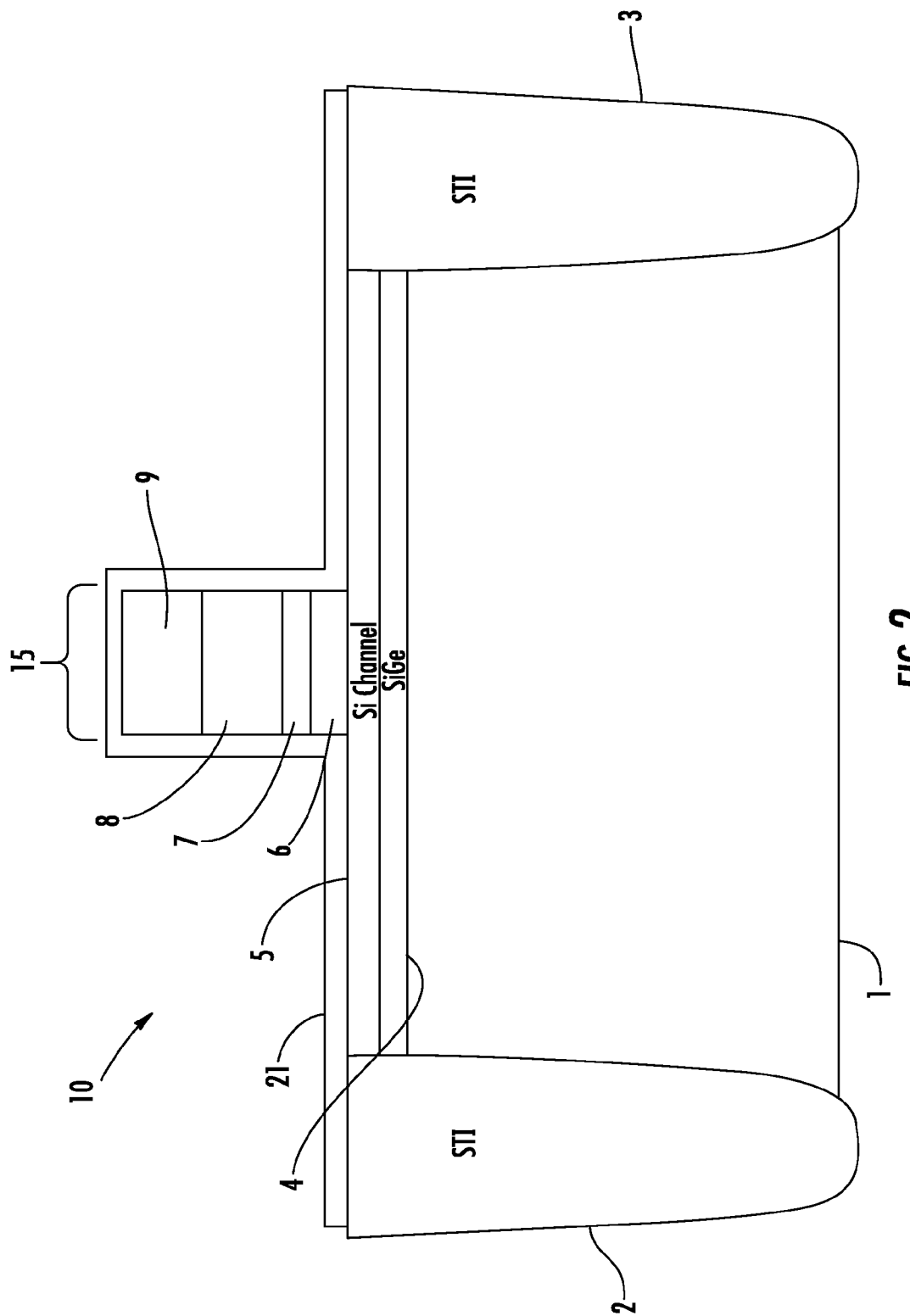
FIG. 2 shows the deposition of a first insulating layer on the semiconductor structure, according to some embodiments.
Figure 3:
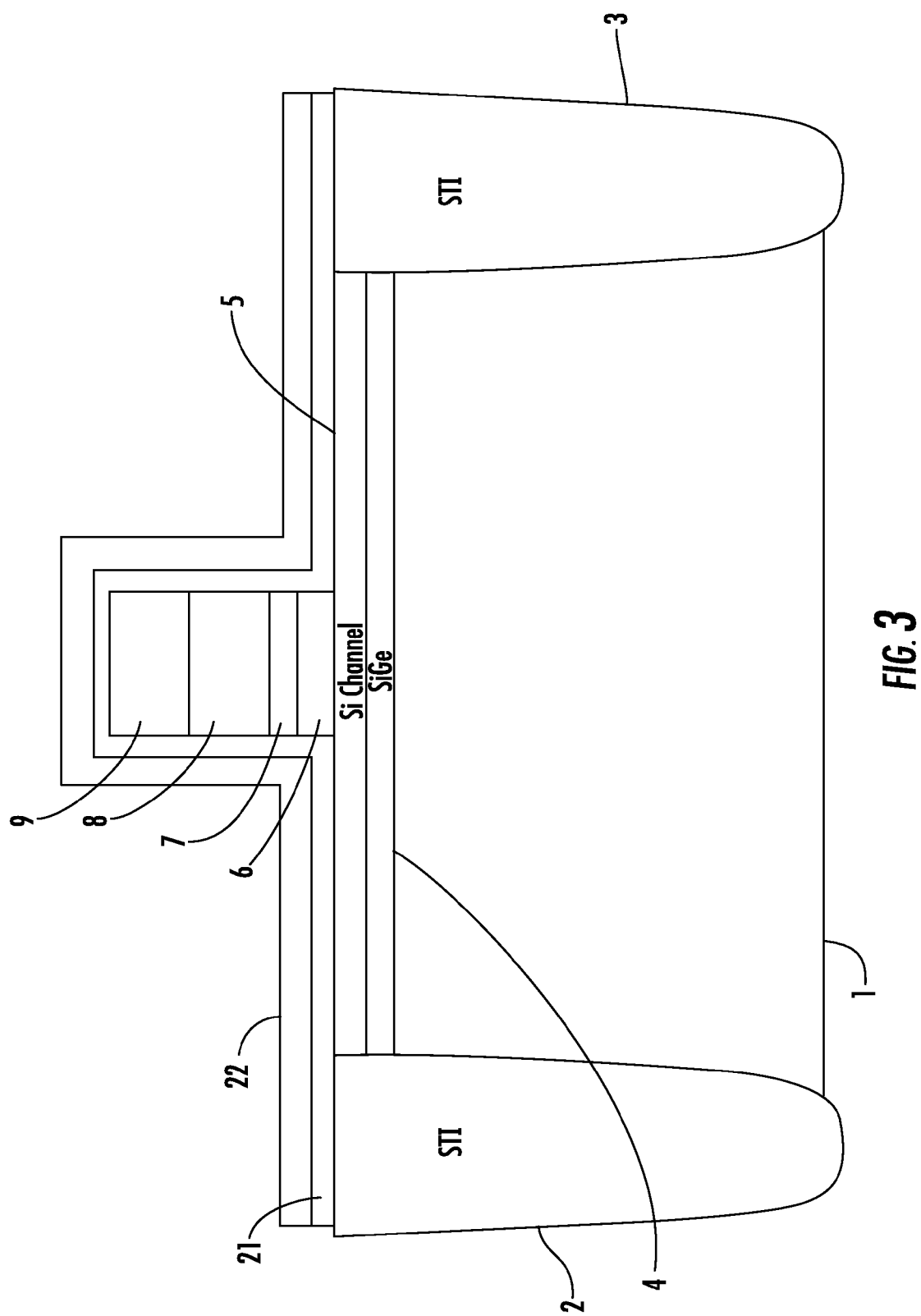
FIG. 3 shows the deposition of a second insulating layer on the first insulating layer, according to some embodiments.
Figure 4:
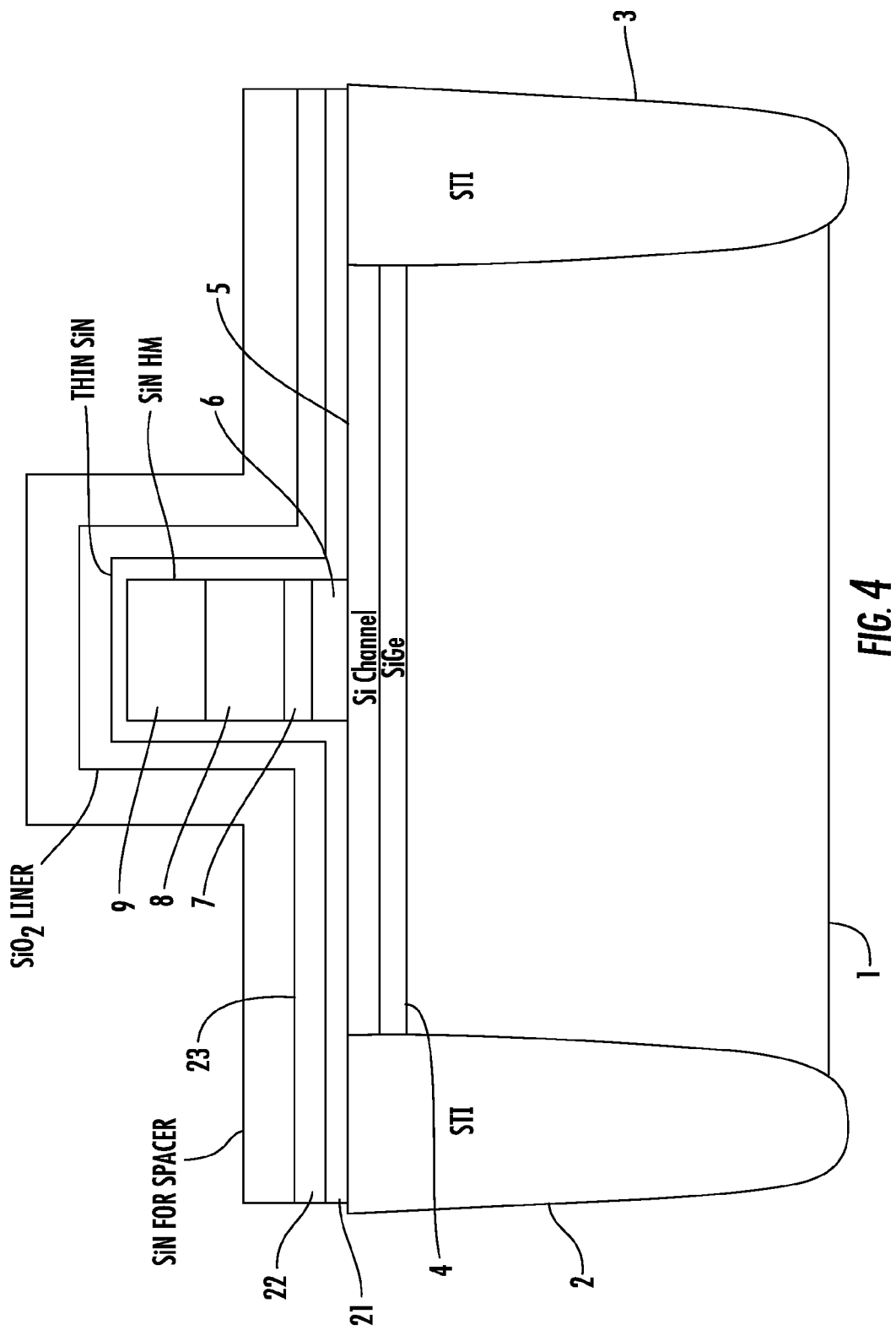
FIG. 4 shows the deposition of a third insulating layer on the second insulating layer, according to some embodiments.

As shown in FIGS. 2-4, insulating layers can be deposited over and adjacent to the gate region 15, and may form spacer regions for the transistor.

FIG. 2 shows that a thin insulating layer 21 can be deposited over the semiconductor device region 5 and the gate region 15. In some embodiments, insulating layer 21 can be formed of silicon nitride. However, the techniques described herein are not limited as to the material used to form insulating layer 21. For example, insulating layer 21 can be formed of a different material that is selectively etchable with respect to semiconductor device region 5.

FIG. 3 shows that an insulating layer 22 can then be deposited over insulating layer 21. In some embodiments, insulating layer 22 may be a thin silicon oxide layer. However, the techniques described herein are not limited as to the material used to form insulating layer 22. For example, insulating layer 22 can be formed of a different material that is selectively etchable with respect to insulating layer 21.

FIG. 4 shows that an insulating layer 23 can then be deposited on insulating layer 22. In some embodiments, insulating layer 23 may be formed of silicon nitride. However, the techniques described herein are not limited as to the material used to form insulating layer 23. For example, insulating layer 23 can be formed of a different material that is selectively etchable with respect to insulating layer 22.

Figure 5:
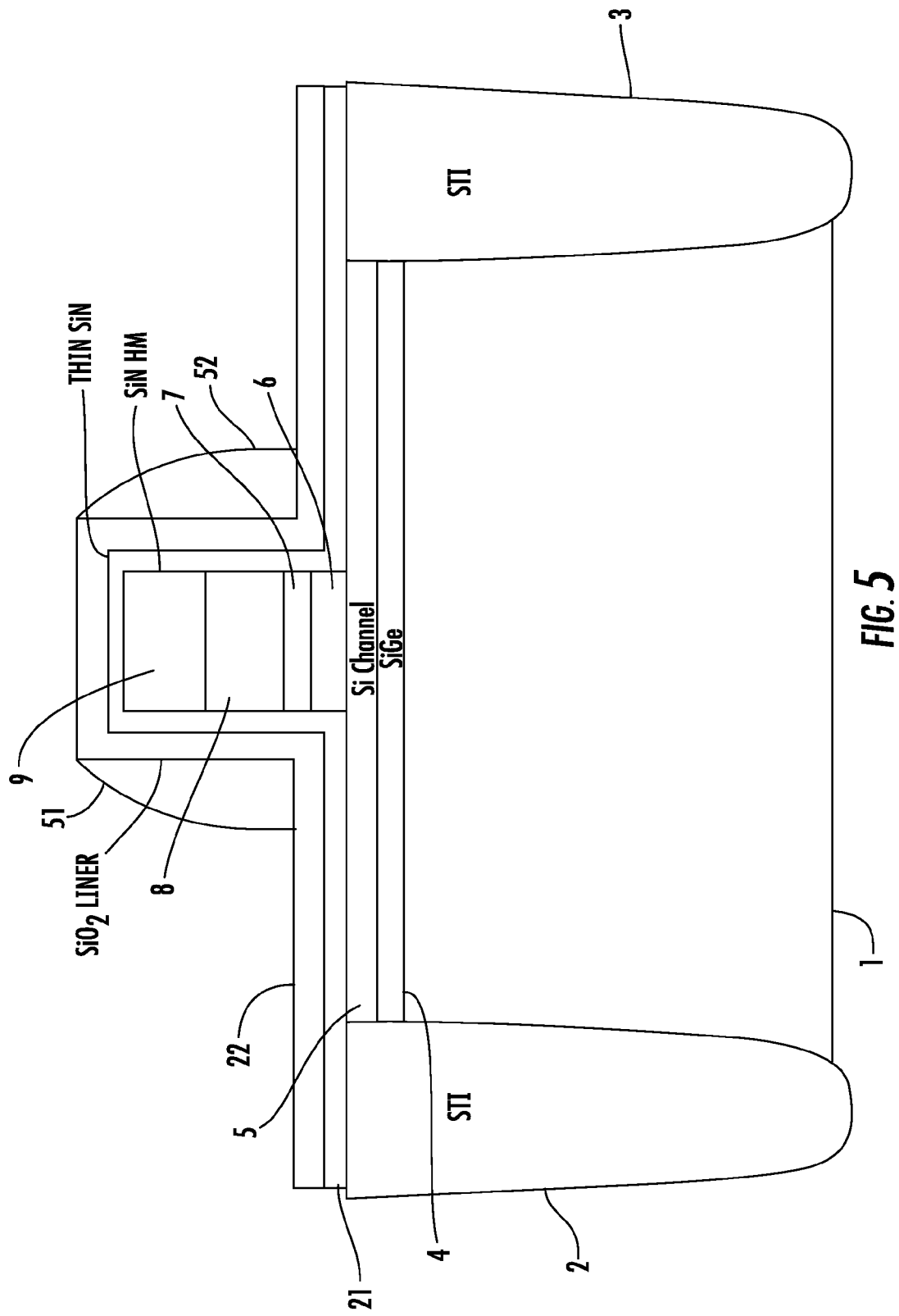
FIG. 5 shows the etching of the third insulating layer to form spacers on the sides of the gate region, according to some embodiments.

As shown in FIG. 5, insulating layer 23 may be etched to form spacers 51, 52 on the sides of the gate region 15. In some embodiments, insulating layer 23 can be etched using a dry etching technique such as a plasma etching technique known as reactive ion etching. Advantageously, insulating layer 22 may act as an etch stop during the process of etching insulating layer 23. In some embodiments, insulating layer 22 is formed of a different material from insulating layer 23 that is not substantially etched in the process used to etch insulating layer 23. Thus, insulating layer 22 can protect the semiconductor device region 5 during the dry etching process used to remove a portion of insulating layer 23.

Figure 6:
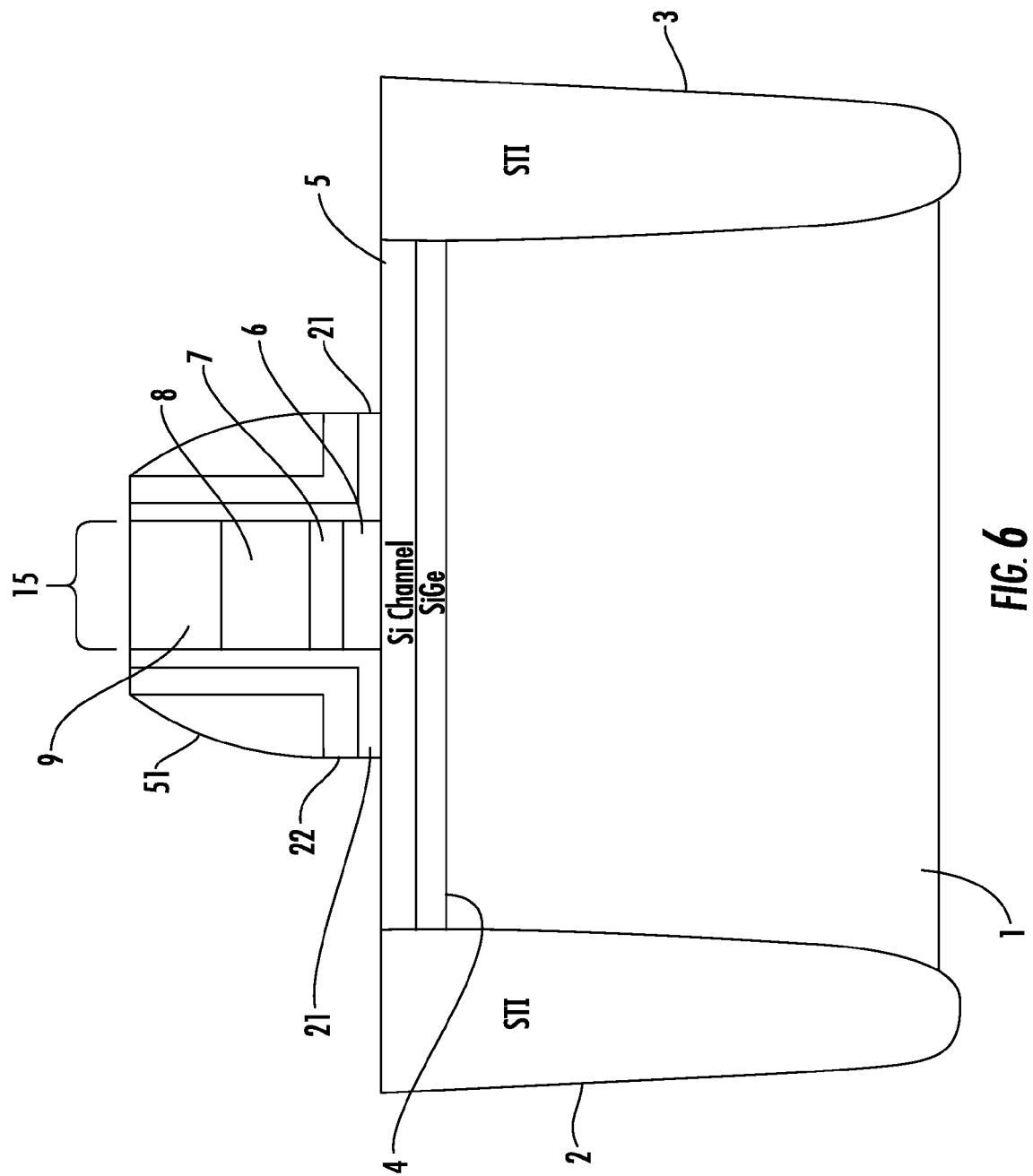
FIG. 6 shows the removal of portions of the first and second insulating layers, according to some embodiments.

As shown in FIG. 6, portions of the insulating layers 21 and 22 on the sides of the gate region may then be removed. In some embodiments, an etching process is used to remove these layers that does not substantially etch the semiconductor device region 5. For example, in some embodiments in which the semiconductor device region is formed of silicon, a hydrofluoric acid (HF) wet etching process may be used that does not substantially remove the semiconductor material on the surface of semiconductor device region 5. However, any suitable etching process may be used to remove portions of insulating layers 21 and 22 that does not substantially etch semiconductor device region 5.

Figure 7:
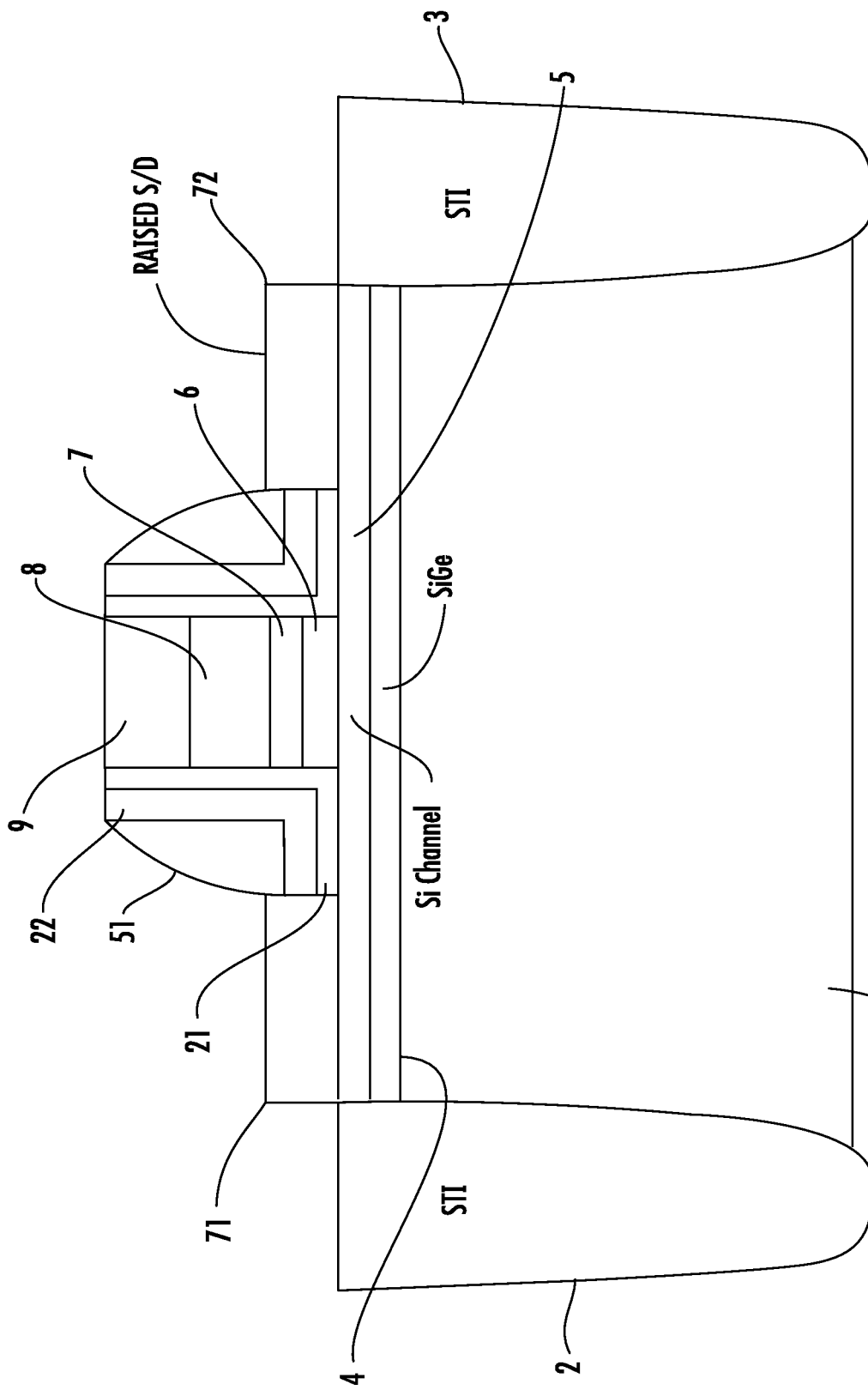
FIG. 7 shows the formation of raised source and drain regions.
Figure 8:
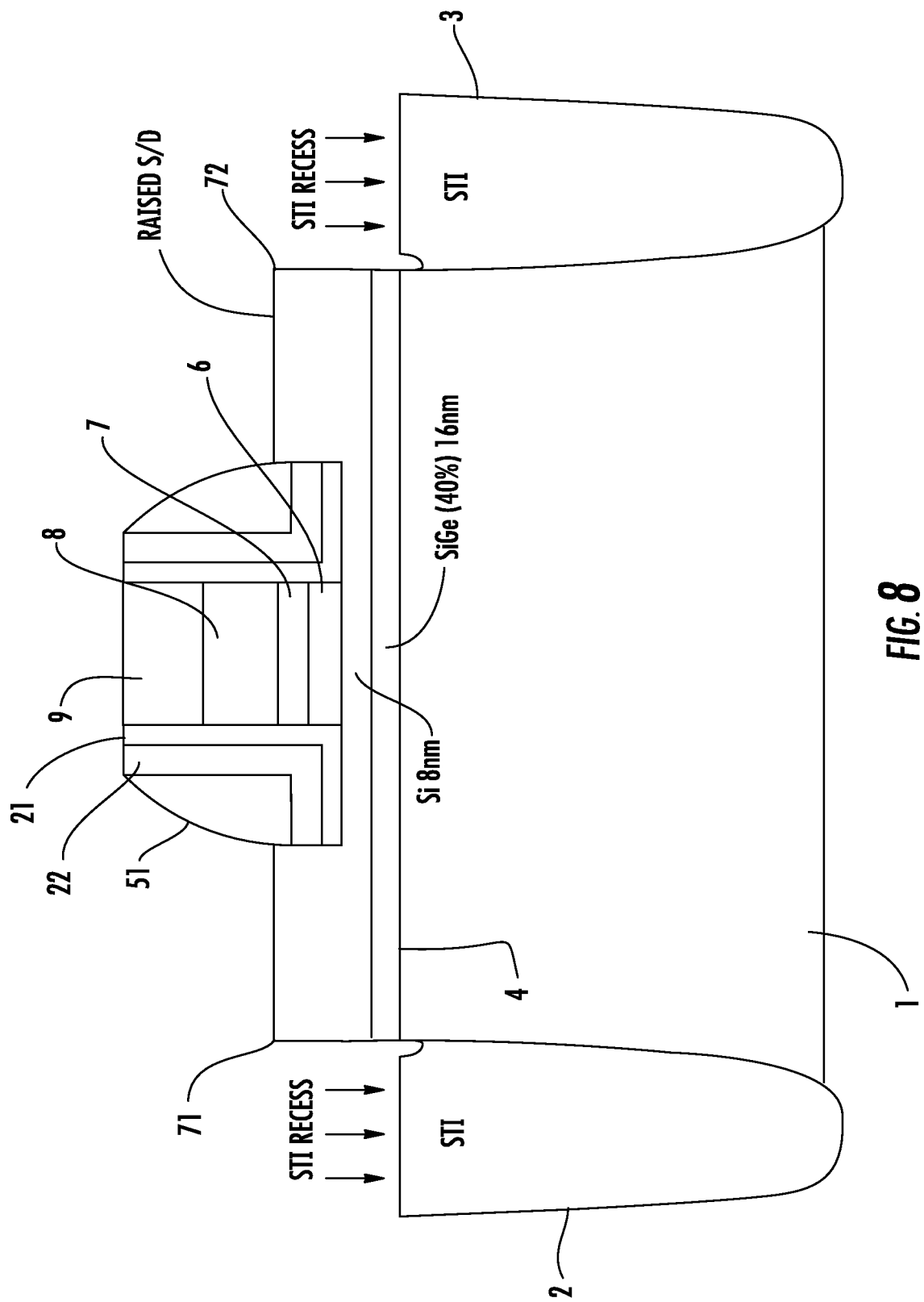
FIG. 8 shows the formation of a recess in the STI regions.
Figure 9:
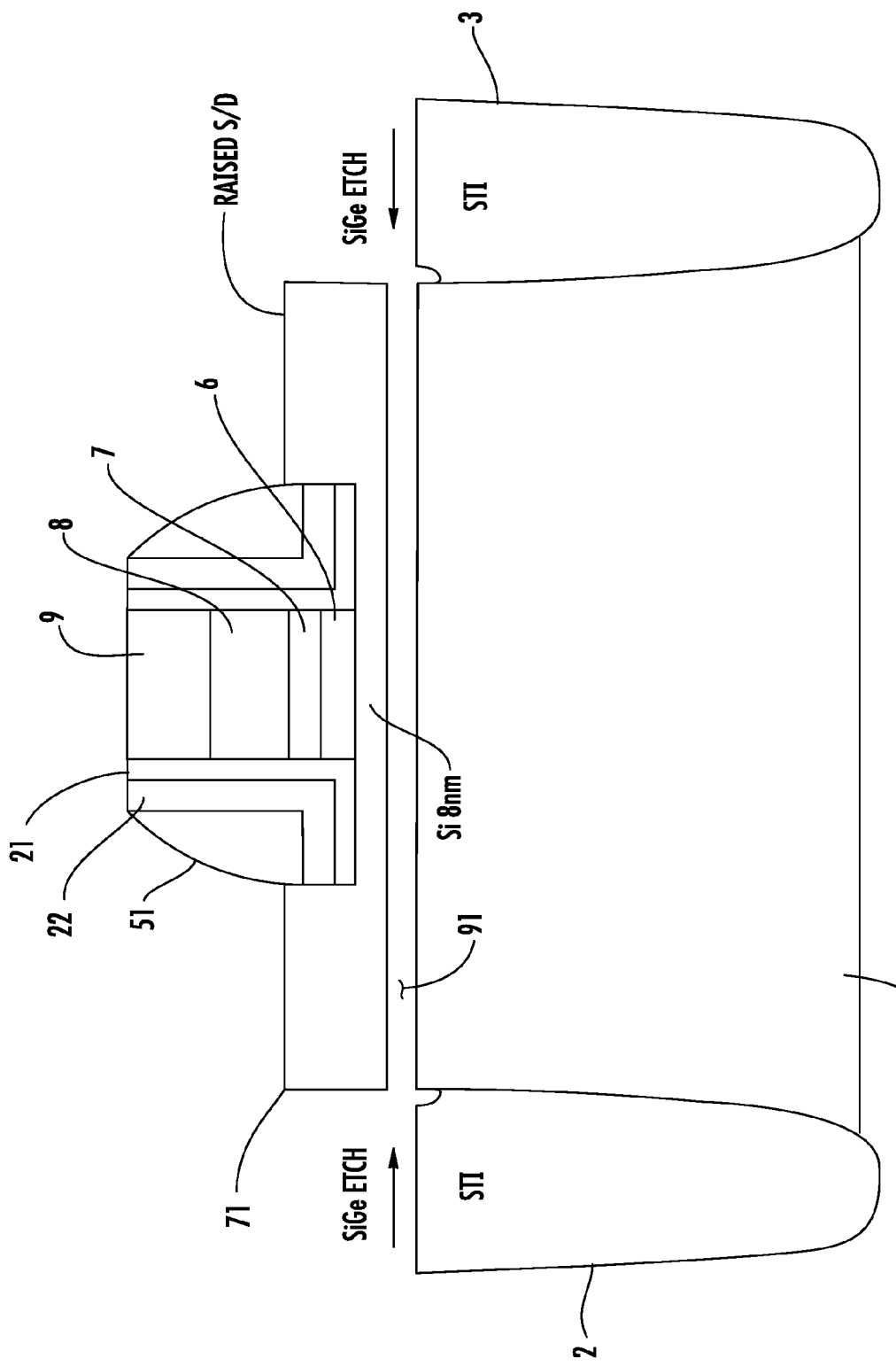
FIG. 9 shows the removal of sacrificial semiconductor layer by etching, thereby forming a cavity beneath the semiconductor device region.

As shown in FIG. 7, raised source and drain regions 71, 72 may be formed on either side of the gate region 15 by any suitable process such as epitaxial deposition, for example. As shown in FIG. 8, a recess may then be formed in the STI regions 2 and 3 to expose the sides of sacrificial semiconductor region 4. Any suitable etching process may be used for removing portions of the STI regions 2 and 3. As shown in FIG. 9, sacrificial semiconductor layer 4 may then be removed by etching, thereby forming a cavity 91 beneath the semiconductor device region 5.

Figure 10:
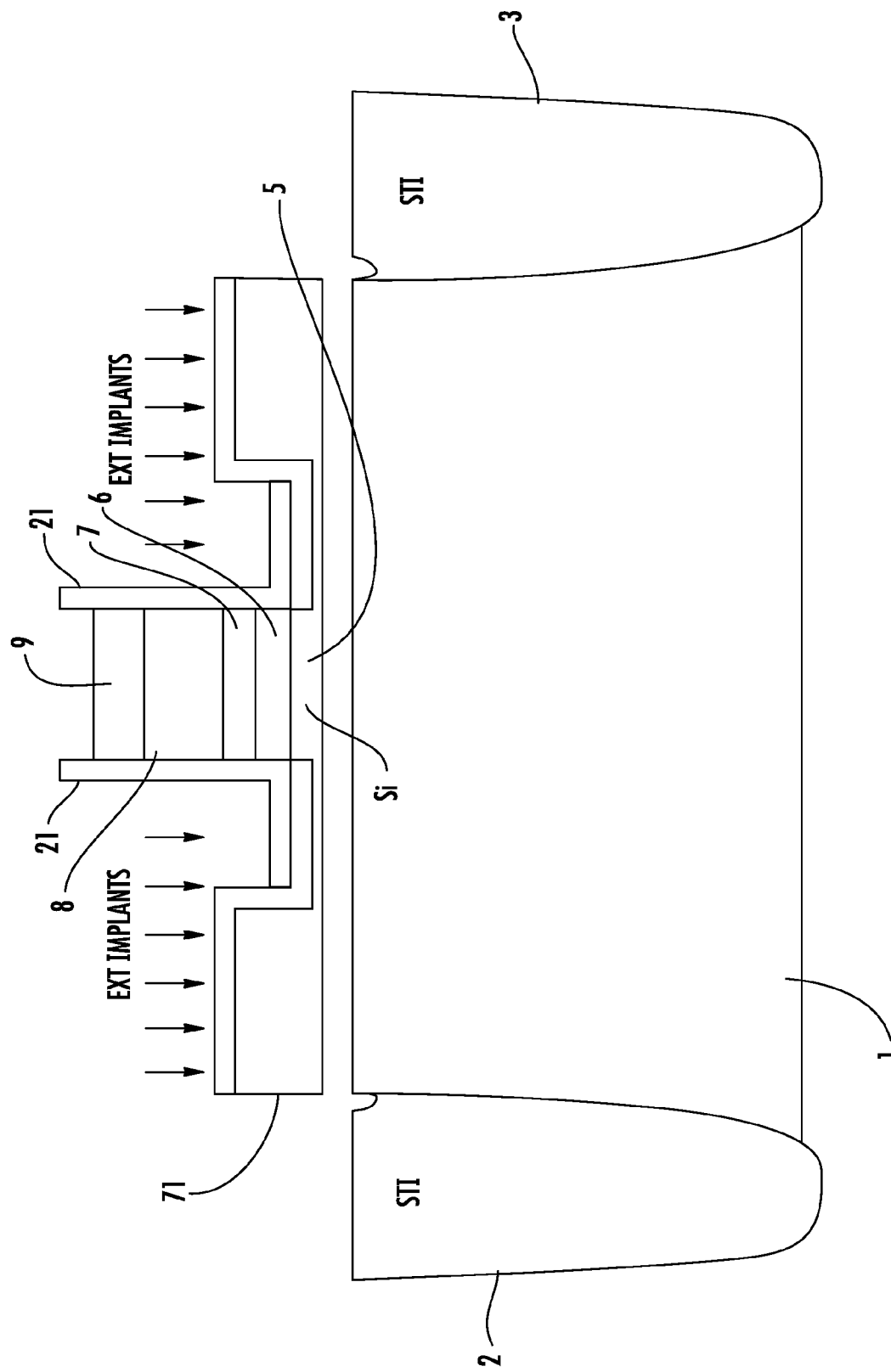
FIG. 10 shows that ion implantation may be performed through the first insulating layer to dope the semiconductor device region on either side of the gate region.

The remaining portions of insulating layers 22 and 23 may be removed by etching. As shown in FIG. 10, one or more portions of the insulating layer 21 may remain above portions of the device layer adjacent to the channel region of the transistor on either side of the gate region 15. As shown in FIG. 10, ion implantation may be performed through the insulating layer 21 to dope the semiconductor device region 5 on either side of the gate region 15. Performing ion implantation through the insulating region 21 can limit the amount of damage that may be caused to semiconductor device layer 5 the during the ion implantation process.

Figure 11:
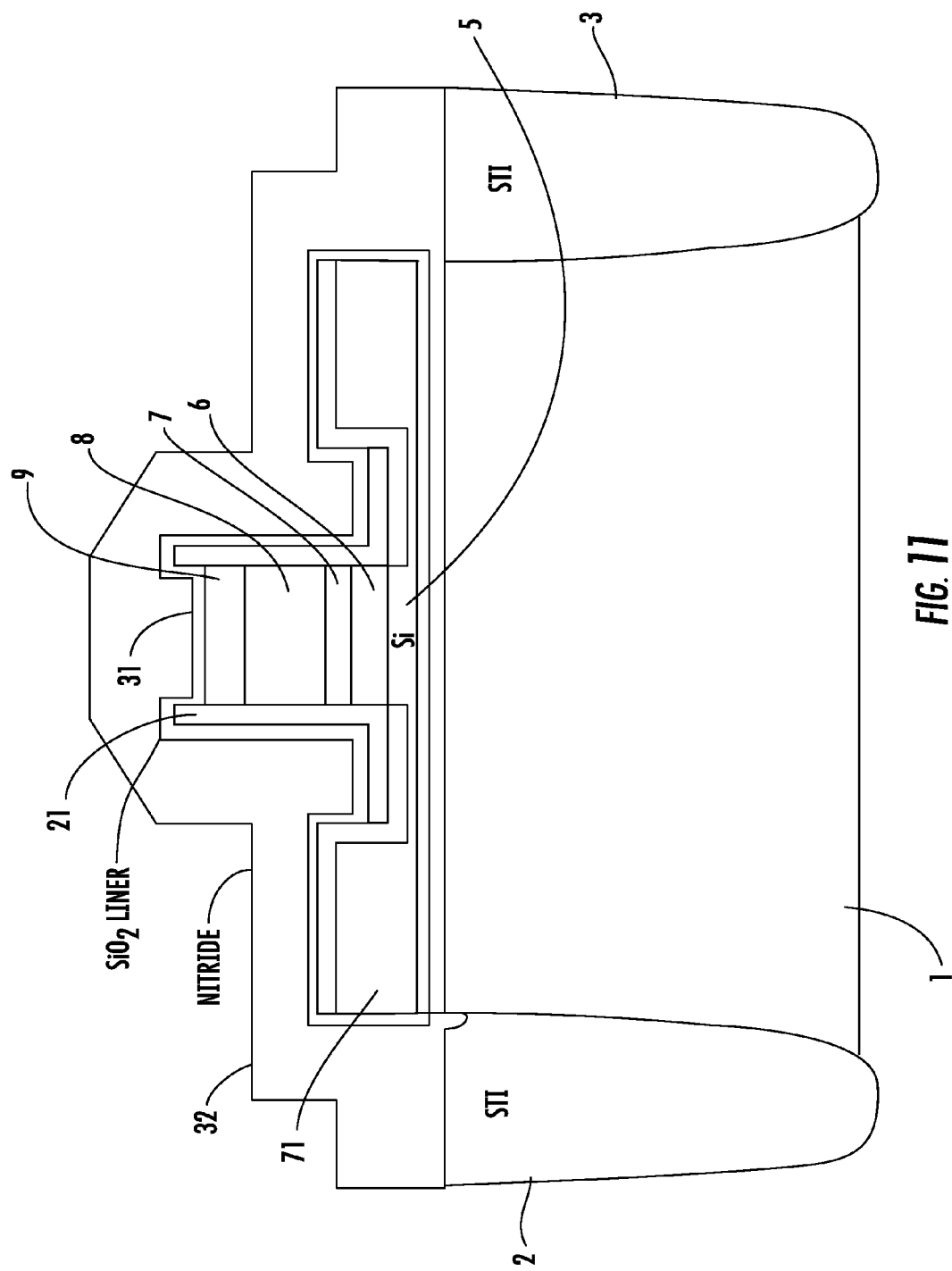
FIG. 11 shows forming additional insulating regions.
Figure 12:
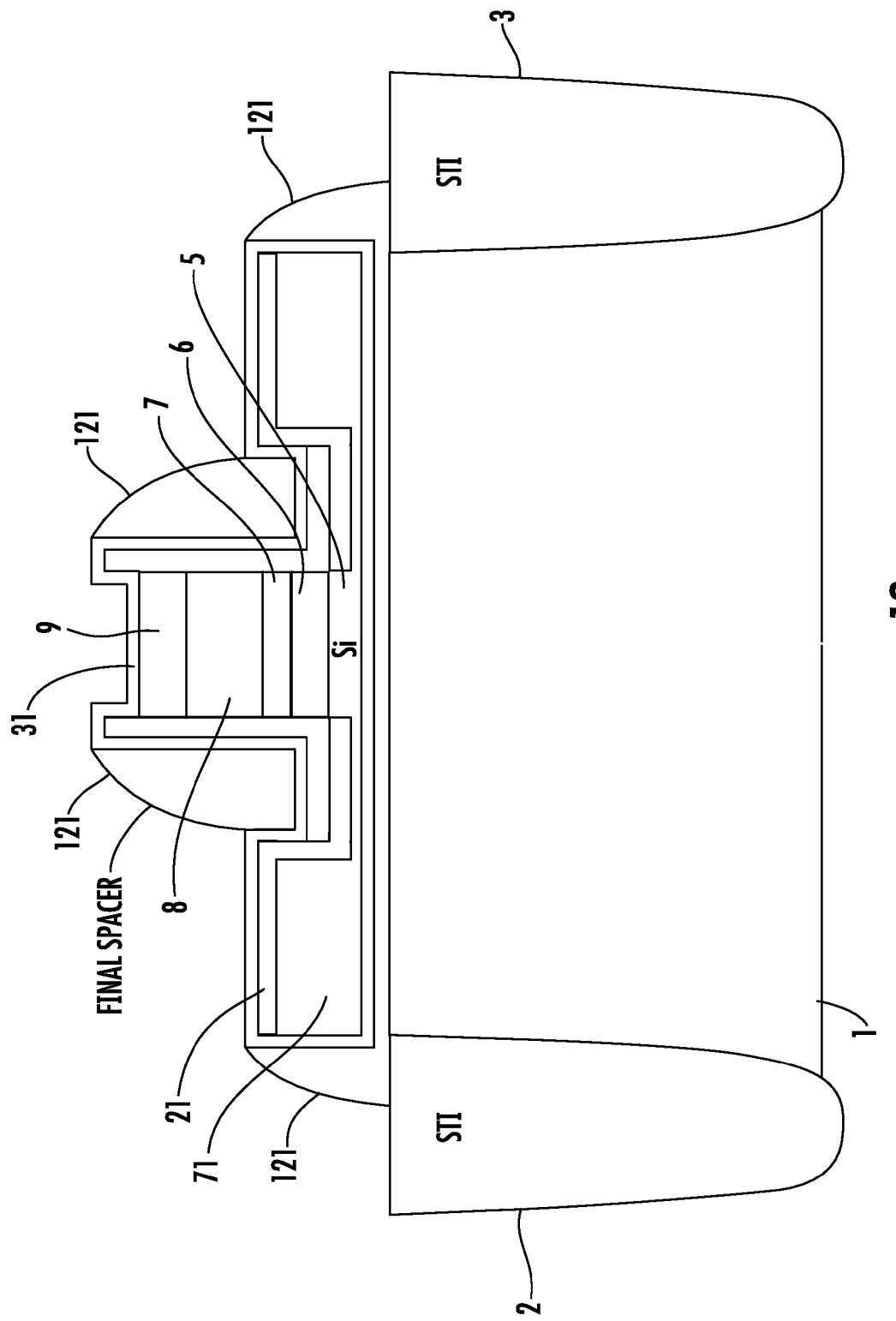
FIG. 12 shows the etching of an additional insulating region to form final spacer regions.
Figure 13:
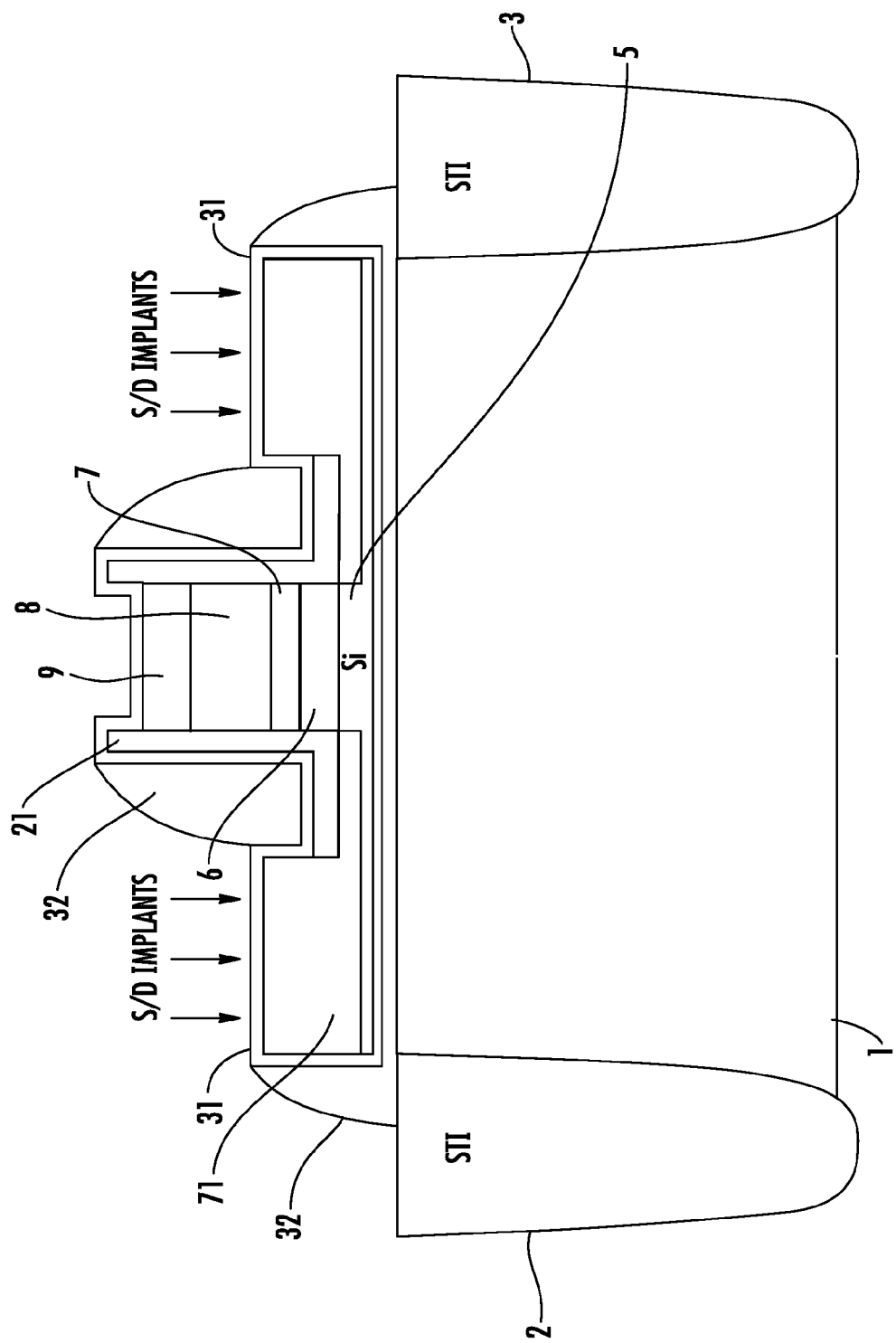
FIG. 13 shows the implantation of dopants for the source and drain regions.

As shown in FIG. 11, an insulating region 31 may be formed on the semiconductor structure above the gate region 15 and the semiconductor device region 5. Insulating layer 31 may be formed of any suitable insulating material, such as silicon oxide. Then, an insulating layer 32 may be formed over the semiconductor structure 10. In some embodiments, the insulating layer 32 may fill the cavity 91 underneath the semiconductor device region 5, which can insulate the semiconductor device layer 5 from semiconductor region 1. Insulating layer 32 may be formed of silicon nitride or any other suitable material. As shown in FIG. 12, the insulating layer 32 may be etched to form final spacer regions 121 adjacent to the gate region 15 and the source and drain regions of the transistor. As shown in FIG. 13, dopants for the source and drain regions may then be implanted through the insulating layer 31.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:
1. A device comprising:
   a semiconductor device region;
   a gate region coupled to an upper surface of said semiconductor device region and extending upwardly from the upper surface to define a plurality of gate sidewalls;
   a source region coupled to the upper surface of said semiconductor device region laterally adjacent said gate region, said source region having a proximal end adjacent said gate region and an enlarged height distal end;
   a drain region coupled to the upper surface of said semiconductor device region laterally adjacent said gate region, said drain region having a proximal end adjacent said gate region and an enlarged height distal end;
   a first insulating layer above the semiconductor device region and coupled to the sidewalls of said gate region and an upper surface of the proximal end of said source and drain regions; and a second insulating layer coupled to the distal end of said source and drain regions, an upper surface of said gate region, said first insulating layer, and a lower surface of said semiconductor device region;

wherein a portion of the semiconductor device region under said first and second insulating layers is doped.

2. The device of claim 1, wherein a portion of the semiconductor device region is a channel region of a transistor.

3. The device of claim 1, wherein the first insulating layer comprises silicon nitride.

4. The device of claim 1, further comprising a bulk semiconductor region below the semiconductor device region.

5. The device of claim 4, further comprising a plurality of isolation regions formed within the bulk semiconductor region, the plurality of isolation regions comprising an insulating material.

6. The device of claim 5, wherein the plurality of isolation regions do not extend above a top surface of the bulk semiconductor region.

7. The device of claim 1, wherein the semiconductor device region has a thickness of six to eight nanometers.

8. The device of claim 1, where the gate region comprises, in a stacked relation:
 a dielectric layer;
 a metal layer;
 a semiconductor layer; and
 an insulating layer.

9. The device of claim 8, wherein the insulating layer comprises silicon nitride.

10. The device of claim 8, wherein the semiconductor layer comprises amorphous silicon.

11. The device of claim 8, wherein the dielectric layer comprises a high-k dielectric material.

12. The device of claim 8, wherein the dielectric layer is in direct contact with the semiconductor device region.

13. The device of claim 1, wherein the device is a transistor.

14. A device comprising:
 a transistor formed on a bulk semiconductor substrate, the transistor comprising
  a channel region
  a gate electrode structure formed on the channel region, the gate electrode structure including a gate dielectric layer and a conductive gate electrode material layer,
  a gate spacer structure formed on at least two sidewalls of the gate electrode structure,
  a doped source region coupled to the channel region, the doped source region having a proximate source end extending from the channel region under the gate spacer structure, the doped source region having a distal source end located farther from the channel region than the proximate source end, wherein a portion of the distal source end is located adjacent to a first portion of the gate spacer structure and is raised relative to the channel region,
  a doped drain region coupled to the channel region, the doped drain region having a proximate drain end extending from the channel region under the gate spacer structure, and the doped drain region having a distal drain end located farther from the channel region than the proximate drain end, wherein a portion of the distal drain end is located adjacent to a second portion of the gate spacer structure and is raised relative to the channel region,
  a first conformal insulating material layer formed over the gate electrode structure, included as part of the gate spacer structure, formed around at least part of the distal source end, formed around at least part of the distal drain end, and formed below at least part of the channel region,
  a first portion of a second insulating material layer included as part of the gate spacer structure over the first insulating material layer,
  a second portion of the second insulating material layer formed on a side of and at least partially below the distal source end over the first insulating material layer, and
  a third portion of the second insulating material layer formed on a side of and at least partially below the distal drain end over the first insulating material layer.

15. The device of claim 14, wherein the first insulating material layer comprises silicon oxide, and wherein the second insulating material layer comprises silicon nitride.

16. The device of claim 14, wherein the gate spacer structure includes a third insulating material layer located on the sidewalls of the gate electrode structure, the third insulating material layer being located between the first insulating material layer and the gate electrode structure.

17. The device of claim 14, wherein the third insulating material layer comprises silicon nitride.

18. The device of claim 14, wherein the conductive gate electrode material layer includes metal, and wherein the gate dielectric layer includes high-k dielectric material.

19. The device of claim 14, wherein the channel region has a lower dopant concentration than the doped source region, and wherein the channel region has a lower dopant concentration than the doped drain region.

20. A device comprising:
 a transistor formed on a bulk semiconductor substrate, the transistor comprising
  a gate electrode structure formed on a channel region, the gate electrode structure including a gate dielectric layer and a conductive gate electrode material layer,
  a gate spacer structure formed on at least two sidewalls of the gate electrode structure,
  a doped source region coupled to the channel region, the doped source region having a proximate source end extending from the channel region under the gate spacer structure, and the doped source region having a distal source end located farther from the channel region than the proximate source end, wherein a portion of the distal source end is located adjacent to a first portion of the gate spacer structure and is raised relative to the channel region,
  a doped drain region coupled to the channel region, the doped drain region having a proximate drain end extending from the channel region under the gate spacer structure, and the doped drain region having a distal drain end located farther from the channel region than the proximate drain end, wherein a portion of the distal drain end is located adjacent to a second portion of the gate spacer structure and is raised relative to the channel region,
  a first portion of a second insulating material layer included as part of the gate spacer structure,
  a second portion of the second insulating material layer formed on a side of and at least partially below the distal source end, and
  a third portion of the second insulating material layer formed on a side of and at least partially below the distal drain end.

21. The device of claim 20, further comprising a first conformal insulating material layer formed over the gate electrode structure, included as part of the gate spacer structure between the second insulating material layer and the gate electrode structure, formed around at least part of the distal source end, and formed around at least part of the distal drain end.

22. The device of claim 21, wherein the first insulating material layer comprises silicon oxide, and wherein the second insulating material layer comprises silicon nitride.

23. The device of claim 21, wherein the gate spacer structure includes a third insulating material layer located on the sidewalls of the gate electrode structure, the third insulating material layer being located between the first insulating material layer and the gate electrode structure.

24. The device of claim 23, wherein the third insulating material layer comprises silicon nitride.

25. The device of claim 20, wherein the conductive gate electrode material layer includes metal, and wherein the gate dielectric layer includes high-k dielectric material.

26. The device of claim 20, wherein the channel region has a lower dopant concentration than the doped source region, and wherein the channel region has a lower dopant concentration than the doped drain region.

* * * * *